United States Patent
Kocon et al.

(10) Patent No.: US 6,602,768 B2
(45) Date of Patent: Aug. 5, 2003

(54) MOS-GATED POWER DEVICE WITH DOPED POLYSILICON BODY AND PROCESS FOR FORMING SAME

(75) Inventors: Christopher B. Kocon, Plains, PA (US); Rodney S. Ridley, Mountaintop, PA (US); Thomas E. Grebs, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/044,768

(22) Filed: Jan. 10, 2002

(65) Prior Publication Data

US 2002/0175383 A1 Nov. 28, 2002

Related U.S. Application Data

(62) Division of application No. 09/731,169, filed on Dec. 6, 2000, now Pat. No. 6,365,942.

(51) Int. Cl.[7] .............................. H01L 21/04
(52) U.S. Cl. ................ 438/510; 438/197; 438/914
(58) Field of Search .................. 438/197, 289, 438/290, 291, 294, 300, 301, 505, 508, 510, 914

(56) References Cited

U.S. PATENT DOCUMENTS

| | | |
|---|---|---|
| 5,717,241 A | 2/1998 | Malhi et al. |
| 5,731,604 A | 3/1998 | Kinzer |
| 5,798,549 A | 8/1998 | Blanchard |
| 5,926,714 A | 7/1999 | Gardner et al. |
| 6,034,388 A | 3/2000 | Brown et al. |
| 6,188,105 B1 | 2/2001 | Kocon et al. |
| 6,198,127 B1 | 3/2001 | Kocon et al. |
| 6,365,942 B1 * | 4/2002 | Kocon et al. ............... 257/376 |

FOREIGN PATENT DOCUMENTS

| | | |
|---|---|---|
| DE | 198 40 402 A | 7/1999 |
| EP | 0 706 223 A | 4/1996 |
| EP | 0 747 967 A | 12/1996 |
| EP | 1 041 638 A | 10/2000 |

OTHER PUBLICATIONS

International Search Report for Int'l. Appl. No. PCT/US01/44374 as prepared by the EPO and completed Feb. 5, 2003.

* cited by examiner

Primary Examiner—David Nelms
Assistant Examiner—David Nhu
(74) Attorney, Agent, or Firm—Thomas R. FitzGerald, Esq.

(57) ABSTRACT

An improved MOS-gated power device 300 with a substrate 101 having an upper layer 101a of doped monocrystalline silicon of a first conduction type that includes a doped well region 107 of a second conduction type. The substrate further includes at least one heavily doped source region 111 of the first conduction type disposed in a well region 107 at an upper surface of the upper layer, a gate region 106 having a conductive material 105 electrically insulated from the source region by a dielectric material, a patterned interlevel dielectric layer 112 on the upper surface overlying the gate and source regions 114, and a heavily doped drain region of the first conduction type 115. The improvement includes body regions 301 containing heavily doped polysilicon of the second conduction type disposed in a well region 107 at the upper surface of the monocrystalline substrate.

10 Claims, 4 Drawing Sheets

MOS-GATED POWER DEVICE WITH DOPED POLYSILICON BODY AND PROCESS FOR FORMING SAME

CROSS-REFERENCE TO RELATED APPLICATIONS

This application is a divisional application of U.S. patent application Ser. No. 09/731,169, filed Dec. 6, 2000 now U.S. Pat. No. 6,365,942.

FIELD OF THE INVENTION

The present invention relates to semiconductor devices and, more particularly, to an MOS-gated power device having a doped polysilicon body and to a process for forming the device

BACKGROUND OF THE INVENTION

FIG. 1 schematically depicts the cross-section of a trench MOS-gated device 100 of the prior art formed on an upper layer 101a of an N+substrate 101. Device 100 includes a trench 102 whose sidewalls 103 and floor 104 are lined with a gate dielectric such as silicon dioxide. Trench 102 is filled with a conductive material 105 such as doped polysilicon, which serves as an electrode for gate region 106.

Upper layer 101a of substrate 101 further includes P-well regions 107 overlying an N-drain zone 108. Disposed within P-well regions 107 at an upper surface 109 of upper layer 101a are heavily doped P+body regions 110 and heavily doped N+source regions 111. An interlevel dielectric layer 112 is formed over gate region 106 and source regions 111. Contact openings 113 enable metal layer 114 to contact body regions 110 and source regions 111. A drain metal layer 115 is applied to the rear surface of N+substrate 101.

FIG. 2 is a schematic cross-sectional view of a vertical planar MOSFET device 200 of the prior art formed on an upper layer 101a of an N+substrate 101. Device 200 includes a planar gate region 201 comprising a gate dielectric layer 202, silicon oxide, for example, and a conductive layer 203, doped polysilicon, for example, that serves as a gate electrode.

Device 200 resembles device 100 in that upper layer 101a further includes P-well regions 107 overlying an N-drain zone 108, and heavily doped P+body regions 110 and heavily doped N+source regions 111 disposed within P-well regions 107 at upper surface 109 of upper layer 101a. An interlevel dielectric layer 112 is formed over gate region 201 and source regions 111, and contact openings 113 enable metal layer 114 to contact body and source regions 110 and 111, respectively. A drain metal layer 115 is applied to the rear surface of N+substrate 101. The body and source regions of devices currently in common use, for example, structures 100 and 200 depicted in FIGS. 1 and 2, respectively, are typically formed by successive implantation and diffusion of dopants of opposite conduction type into a semiconductor substrate, a procedure that requires the use of two photoresist masks, one for the source, the other for the body. Lateral diffusion of dopants, high energy implantation scatter during body formation, and allowance for possible misalignment are factors that adversely affect efforts to reduce the size of the device. There is a need for power devices of reduced size relative to those in current use the present invention meets this need.

SUMMARY OF THE INVENTION

The present invention is directed to an improved MOS-gated power device on a substrate having an upper layer of doped monocrystalline silicon of a first conduction type that includes a doped well region of a second conduction type. The substrate further comprises at least one heavily doped source region of the first conduction type disposed in the well region at an upper surface of the upper layer, a gate region comprising a conductive material electrically insulated from the source region by a dielectric material, a patterned interlevel dielectric layer on the upper surface overlying the gate and source regions, and a heavily doped drain region of the first conduction type. The improvement comprises: body regions comprising heavily doped polysilicon of the second conduction type disposed in the well region at the upper surface of the monocrystalline silicon substrate.

The invention is further directed to a process for forming an MOS-gated power device that comprises: providing a substrate having an upper layer of doped monocrystalline silicon of a first conduction type that includes a doped well region of a second conduction type. The substrate further comprises a heavily doped source regions of the first conduction type disposed in the well region at an upper surface of the upper layer, a gate region comprising a conductive material electrically insulated from the source region by a dielectric material, heavily doped drain region of the first conduction type, a patterned interlevel dielectric layer on the upper surface overlying the gate and source regions.

The process further comprises: forming a body mask on the substrate, and selectively removing portions of the source region and underlying well region remotely disposed from the gate region, thereby forming at least one body hollow in the substrate; removing the body mask, and forming a blanket layer of heavily doped polysilicon of the second conduction type that overlies the substrate and interlevel dielectric layer and fills the body hollow; selectively removing portions of the polysilicon blanket layer from the source region and interlevel dielectric layer, leaving heavily doped polysilicon filling the body hollow and thereby forming a body region; depositing over the upper surface and interlevel dielectric layer a source metal layer in electrical contact with the source and body regions; and forming a drain metal layer in contact with the drain region in the substrate.

DETAILED DESCRIPTION OF THE INVENTION

Figure 1:
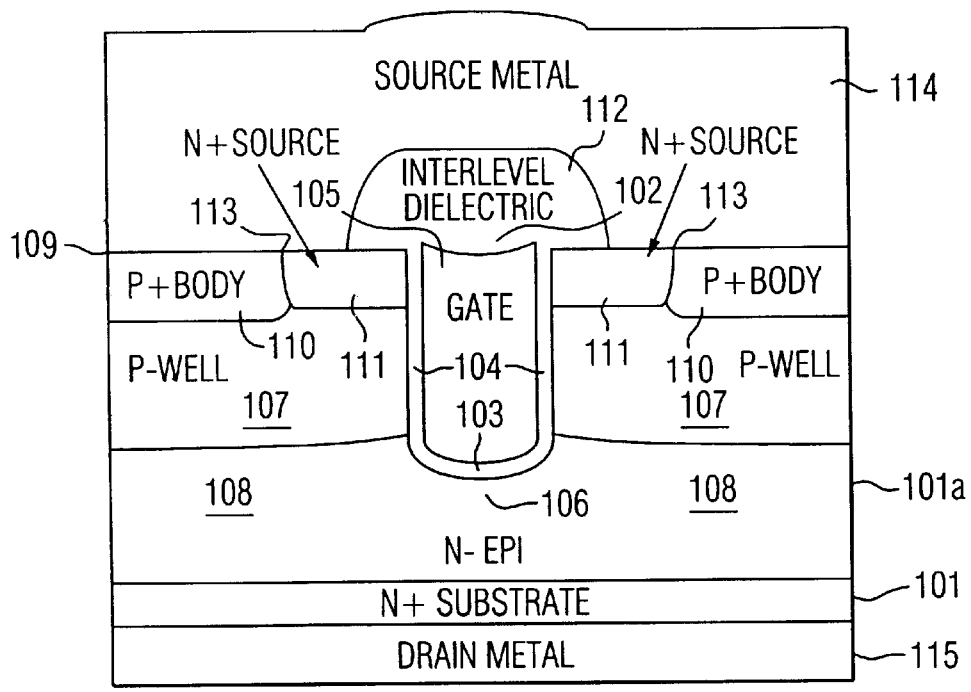
FIGS. 1 and 2 schematically depict cross-sections of, respectively, a trench MOS-gated and a vertical planar MOS device of the prior art.
Figure 2:
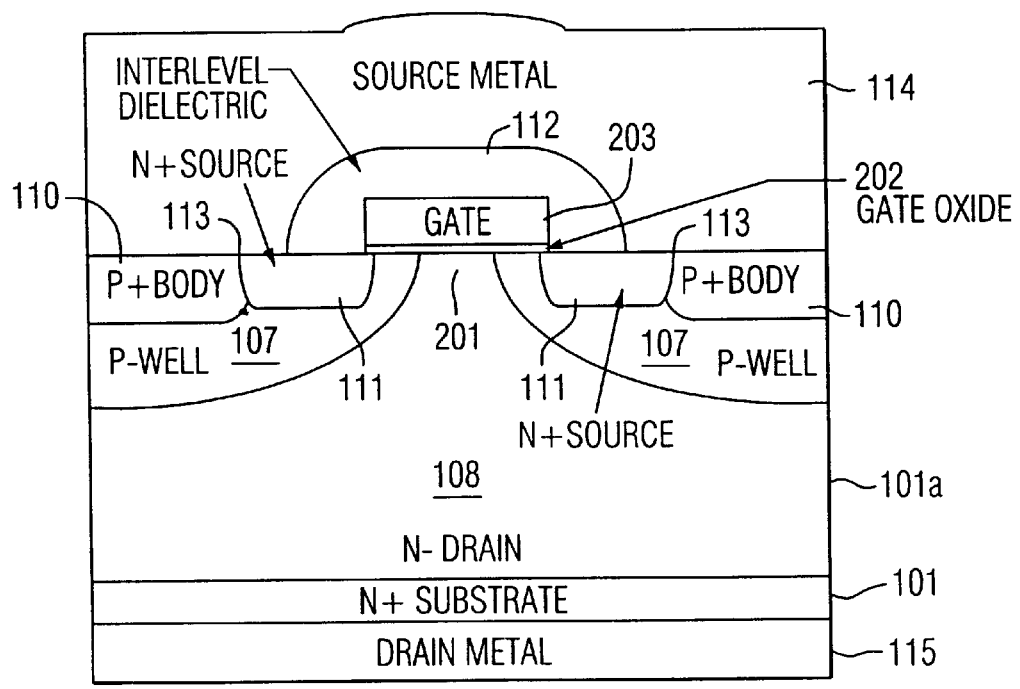
Figure 3:
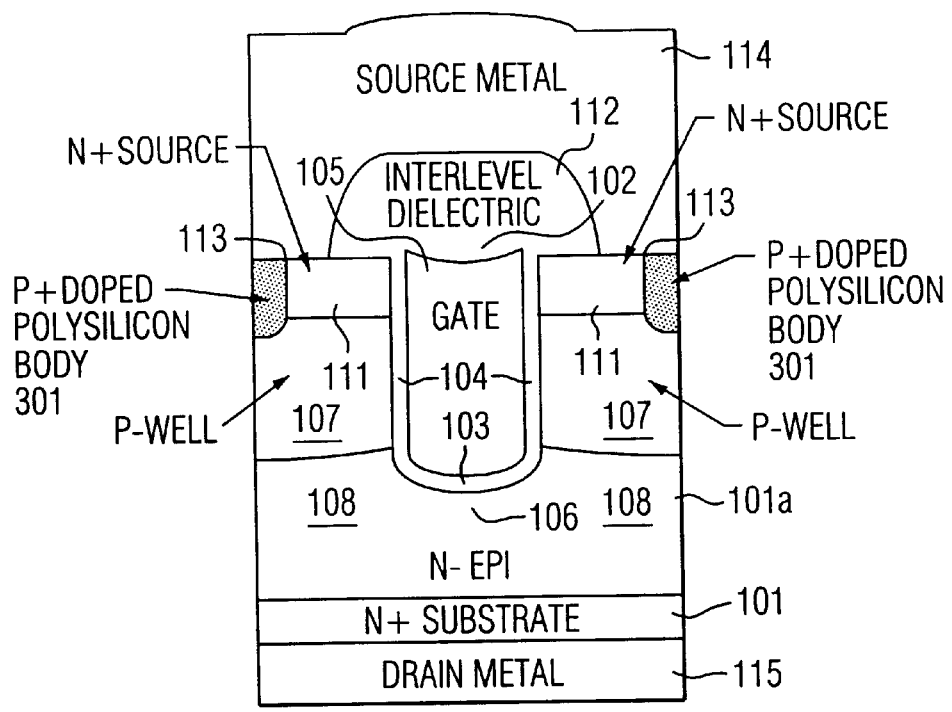
FIGS. 3 and 4 are schematic cross-sectional representations of, respectively, a trench MOS-gated and a vertical planar MOS device in accordance with the present invention.

In FIG. 3 is schematically depicted the cross-section of a trench MOS-gated device 300 of the present invention formed on an upper layer 101a of an N+substrate 101. As with device 100 of the prior art, device 300 includes a trench 102 whose sidewalls 103 and floor 104 are lined with a gate dielectric such as silicon dioxide. Trench 102 is filled with a conductive material 105 such as doped polysilicon, which serves as an electrode for gate region 106.

Upper layer 101a of substrate 101 further includes P-well regions 107 overlying an N-drain zone 108. Disposed within P-well regions 107 at an upper surface 109 of upper layer 101a are heavily doped N+source regions 111. Also disposed at upper surface 109 within P-well regions 107 are P+body regions 301 comprising, in accordance with the present invention, heavily doped polysilicon. Device 300 further includes interlevel dielectric layer 112, contact openings 113, source metal layer 114, and drain metal layer 115, corresponding to those elements in prior art device 100.

Figure 4:
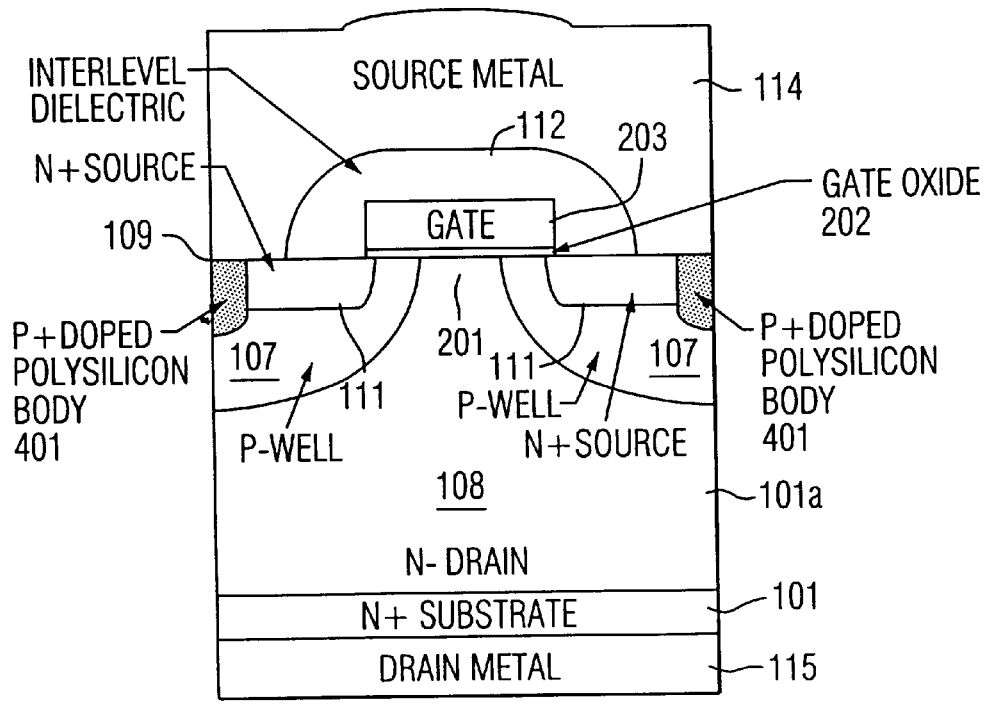

FIG. 4 schematically illustrates a planar MOSFET device 400 of the present invention formed on an upper layer 101a of an N+substrate 101 and including a planar gate region 201 comprising a gate dielectric layer 202, silicon oxide, for example, and a conductive layer 203, doped polysilicon, for example, that serves as a gate electrode. Planar device 400 resembles prior art device 200 in that upper layer 101a further includes P-well regions 107 overlying an N-drain zone 108, and heavily doped N+source regions 111 disposed within P-well regions 107 at upper surface 109 of upper layer 101a. Also disposed at upper surface 109 within P-well regions 107 are P+body regions 401 comprising, in accordance with the present invention, heavily doped polysilicon. Device 400 further includes interlevel dielectric layer 112, contact openings 113, source metal layer 114, and drain metal layer 115, corresponding to those elements in prior art device 200.

Although FIGS. 3 and 4 each show only one MOSFET, devices currently employed in the industry consist of an array of such devices having striped open-cell or closed-cell topology.

Figure 5A:
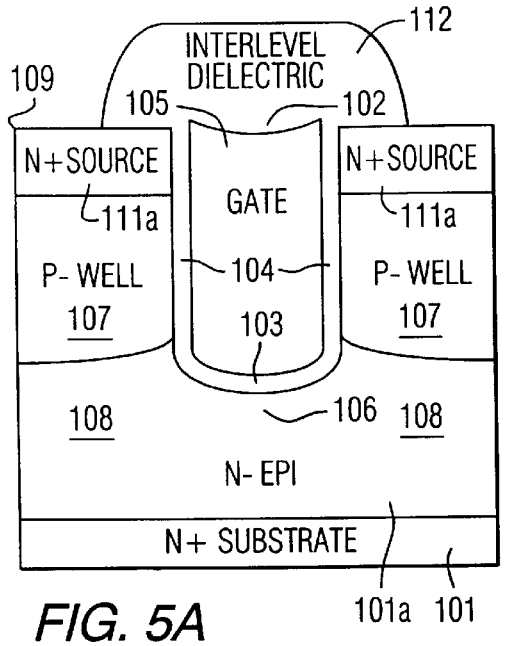
FIGS. 5A–D depict a process for forming a trench MOS-gated power device of the present invention.

In FIGS. 5A–D is depicted a process for making trench MOS-gated device 300 of the present invention. FIG. 5A depicts a structure, obtained by procedures standard in the industry, having a substrate 101 that includes an upper layer 101a, preferably an epitaxial layer, in which is formed P-well regions 107 and a gate trench region 106 comprising a trench 102 lined with dielectric sidewalls 104 and floor 103 and substantially filled with a semiconductor material 105. An N+dopant is implanted and driven to form blanket N+source regions 111a, and a patterned interlevel dielectric layer 112 is formed on substrate 101.

Figure 5B:
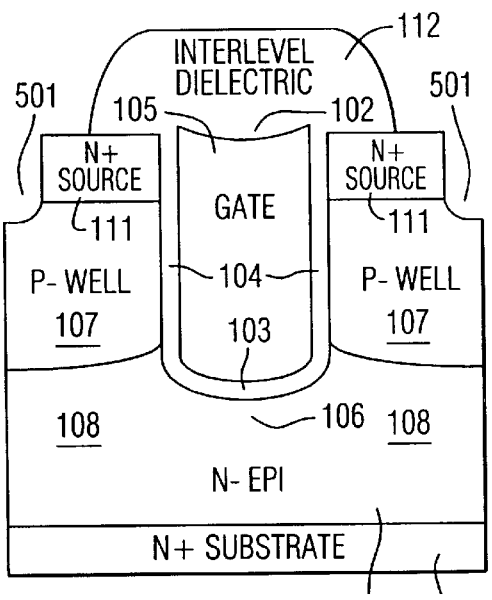
Figure 5C:
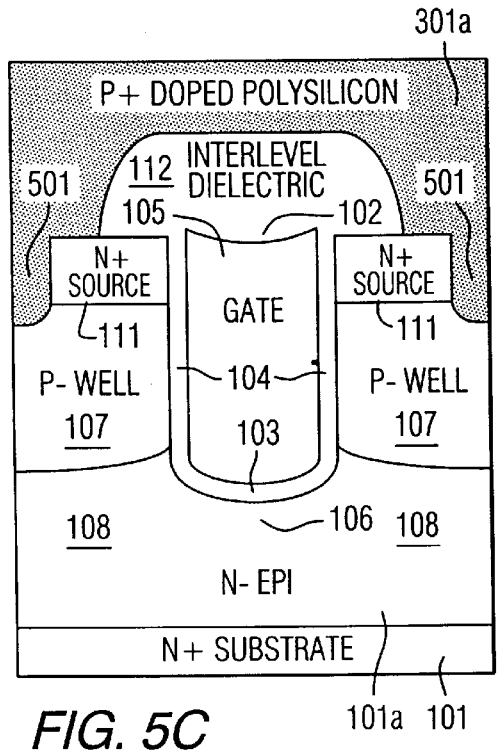

As shown in FIGS. 5B and 5C, a photoresist mask (not shown) is employed to dimple etch portions of N+blanket source regions 111a and P-well regions 107, and, following removal of the mask, a blanket layer 301a of heavily doped polysilicon is formed on interlevel dielectric layer 112 and substrate 101, filling the hollows 501 produced by the etching of regions 111a and 107.

Figure 5D:
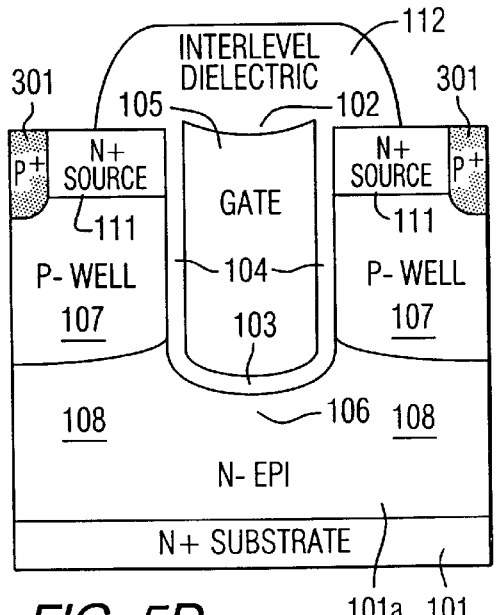

FIG. 5D depicts the controlled etching of highly doped polysilicon blanket layer 301a, leaving body regions 301 comprising heavily P+doped polysilicon adjacent N+source regions 111. Deposition of source metal layer 114 and drain metal layer 115 completes the fabrication of device 300, as shown in FIG. 3.

Because it avoids a source photoresist masking step and its required misalignment tolerance allowance, and further avoids possible lateral diffusion of dopants and high energy implantation scatter during body formation, the process of the present invention provides for the formation of very narrow body regions 301 compared with body regions 110 in device 100, resulting in a device 300 of reduced size relative to that of prior art devices.

Variations of the described specific process flow are contemplated as being within the present invention. For example, the process depicted in FIGS. 5A–D for the fabrication of trench MOS-gated device 300 can be applied to form planar MOS device 400 of the present invention.

Figure 6:
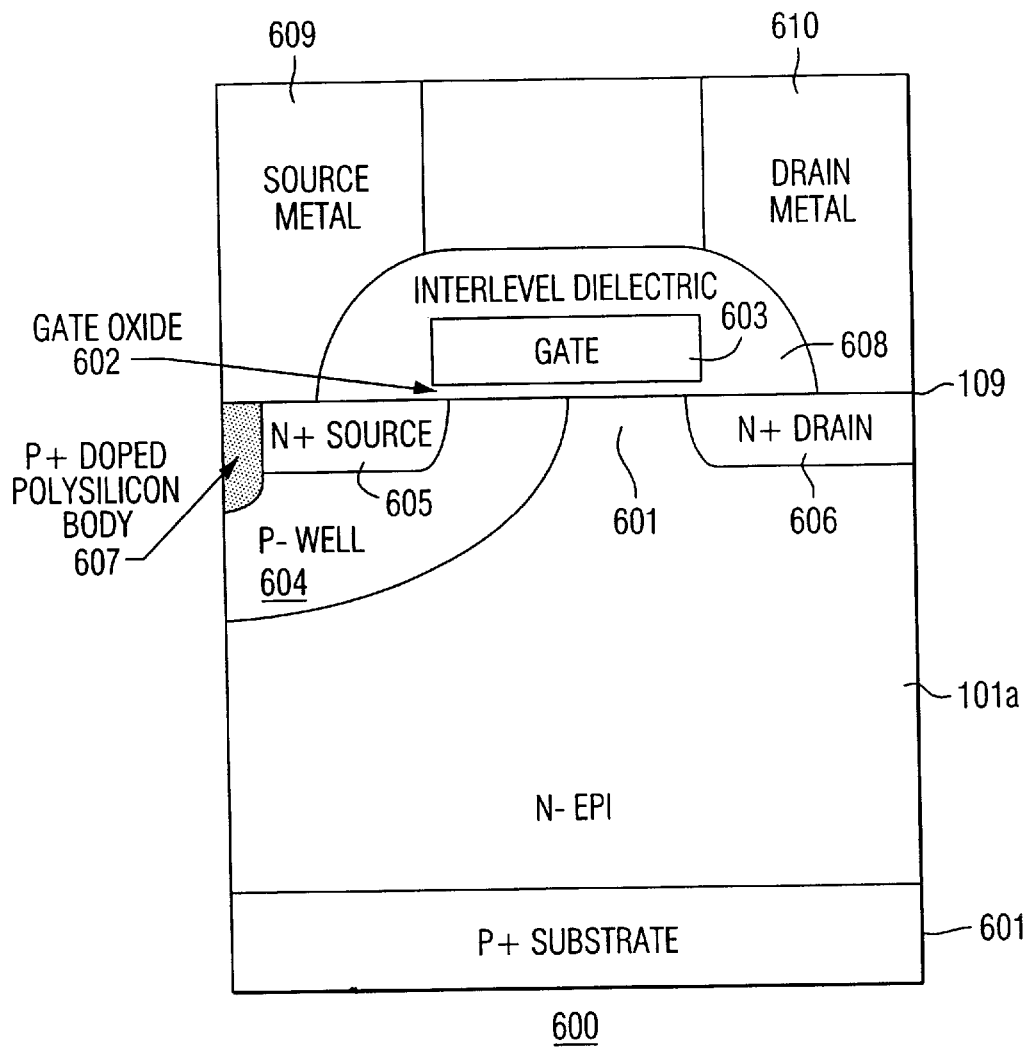
FIG. 6 is a schematic cross-sectional representation of a lateral MOSFET in accordance with the present invention.

FIG. 6 schematically depicts a lateral MOSFET 600 of the present invention formed on an upper layer 101a of a P+substrate 601, which may optionally include an N+buried layer (not shown) located beneath upper layer 101a. Device 600 includes a gate region 601 comprising a gate dielectric layer 602, silicon oxide, for example, and a conductive layer 603, doped polysilicon, for example, that serves as a gate electrode. Lateral device 600 further includes a P-well region 604 and heavily doped N+source and drain regions 605 and 606, respectively, disposed at upper surface 109 of upper layer 101a, source region 605 being situated within P-well region 604. Also disposed at upper surface 109 within P-well region 604 is a P+body region 607 comprising, in accordance with the present invention, heavily doped polysilicon. Device 600 further includes interlevel dielectric layer 608, and source and drain metal layers 609 and 610, respectively, which are in contact with source and drain regions 605 and 606, respectively.

Although the embodiments described above relate to MOS power devices, one skilled in the art may adapt the present invention to other devices, including insulated gate bipolar transistors and MOS-controlled thyristors.

The invention has been described in detail for the purpose of illustration, but it is understood that such detail is solely for that purpose, and variations can be made therein by those skilled in the art without departing from the spirit and scope of the invention, which is defined by the following claims.

What is claimed is:

1. A process for forming an MOS-gated power device comprising:

providing a substrate having an upper layer, said substrate comprising in said upper layer doped monocrystalline silicon of a first conduction type and including a doped well region of a second conduction type, said substrate further comprising at least one heavily doped source region of said first conduction type disposed in said well region at an upper surface of said upper layer, a gate region comprising a conductive material electrically insulated from said source region by a dielectric material, a heavily doped drain region of said first conduction type, and a patterned interlevel dielectric layer on said upper surface overlying said gate and source regions;

forming a body mask on said substrate, and selectively removing portions of said source region and underlying well region remotely disposed from said gate region, thereby forming at least one body hollow in said substrate;

removing said body mask, and forming a blanket layer of heavily doped polysilicon of said second conduction type over said substrate and said interlevel dielectric layer, said polysilicon filling said body hollow;

selectively removing portions of said polysilicon blanket layer from said source region and said interlevel dielectric layer, leaving polysilicon filling said body hollow, said hollow filled with heavily doped polysilicon comprising a body region;

depositing over said upper surface and interlevel dielectric layer a source metal layer in electrical contact with said source and body regions; and forming a drain metal layer in contact with said drain region in said substrate.

2. The process of claim 1 wherein said upper layer is an epitaxial layer.

3. The process of claim 1 wherein said first conduction type is N and said second conduction type is P.

4. The process of claim 1 wherein said conductive material in said gate region comprises doped polysilicon and said dielectric material in said gate region comprises silicon dioxide.

5. The process of claim 1 wherein said power device comprises a trench MOS-gated device.

6. The process of claim 1 wherein said power device comprises a planar MOS device.

7. The process of claim 1 wherein said power device comprises a lateral MOSFET.

8. The process of claim 5 wherein said device comprises a plurality of extended trenches.

9. The process of claim 8 wherein said plurality of extended trenches have an open-cell striped topology or a closed-cell striped topology.

10. The process of claim 1 wherein said power device is selected from the group consisting of a power MOSFET, an insulated gate bipolar transistor, and an MOS-controlled thyristor.

* * * * *